United States Patent
Afghahi

(10) Patent No.: US 6,737,898 B2
(45) Date of Patent: May 18, 2004

(54) HIGH SPEED FLIP-FLOP

(75) Inventor: Morteza Cyrus Afghahi, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 10/379,219

(22) Filed: Mar. 4, 2003

(65) Prior Publication Data

US 2003/0151436 A1 Aug. 14, 2003

Related U.S. Application Data

(63) Continuation of application No. 10/000,534, filed on Oct. 23, 2001, now Pat. No. 6,556,059, which is a continuation of application No. 09/732,444, filed on Dec. 7, 2000, now abandoned.

(60) Provisional application No. 60/170,594, filed on Dec. 13, 1999.

(51) Int. Cl.[7] .................................................. H03K 3/12
(52) U.S. Cl. ........................ 327/199; 327/200; 327/201
(58) Field of Search ................................ 327/199, 200, 327/201, 202, 203, 208, 210, 211, 212, 213

(56) References Cited

U.S. PATENT DOCUMENTS

| | | | |
|---|---|---|---|
| 4,486,673 A | 12/1984 | Koike | 327/210 |
| 4,768,167 A | 8/1988 | Yoder | 365/156 |
| 5,111,078 A | 5/1992 | Miyamoto et al. | 326/70 |
| 5,355,391 A | * 10/1994 | Horowitz et al. | 375/36 |
| 5,384,493 A | 1/1995 | Furuki | 327/203 |
| 5,491,667 A | 2/1996 | Sharp | 365/205 |
| 5,526,314 A | 6/1996 | Kumar | 365/207 |
| 5,903,171 A | 5/1999 | Shieh | 327/55 |
| 6,052,328 A | * 4/2000 | Turnullo, Jr. et al. | 365/233 |
| 6,556,059 B2 | 4/2003 | Afghahi | 327/199 |

FOREIGN PATENT DOCUMENTS

| EP | 0 440 514 | 8/1991 |
|---|---|---|
| EP | 0 793 342 | 9/1997 |

OTHER PUBLICATIONS

International Search Report dated Jan. 14, 2002 from PCT/US00/42634.
Written Opinion dated Apr. 17, 2002 from PCT/US00/42634.

* cited by examiner

Primary Examiner—Tuan T. Lam
Assistant Examiner—Hiep Nguyen
(74) Attorney, Agent, or Firm—Christie, Parker & Hale, LLP

(57) ABSTRACT

A static latch can be converted to a dynamic latch by closing a pair of switches. When the switches are open, a first pair of back-to-back transistors serves as the static latch. When the switches are closed, a second pair of back-to-back transistors is connected to the first pair so the two pairs acting together serve as a dynamic latch.

27 Claims, 5 Drawing Sheets

STATIC LATCH

HIGH SPEED FLIP-FLOP

CROSS-REFERENCE TO RELATED APPLICATIONS

This application is a continuation of application Ser. No. 10/000,534, filed Oct. 23, 2001 U.S. Pat. No. 6,556,059, which is a continuation of application Ser. No. 09/732,444, filed Dec. 7, 2000 ABN, which claimed the benefit of the filing date of Provisional Application No. 60/170,594, filed Dec. 13, 1999 now abandoned.

BACKGROUND OF THE INVENTION

This invention relates to bistable electronic circuits and, more particularly, to a high speed flip-flop.

Flip-flops have many applications in electronic systems. Speed of operation and power efficiency are important characteristics of a flip-flop.

A flip-flop can be controlled by a clock to operate upon a data stream as a latch. A dynamic latch generally is capable of operating at a higher speed and with lower power consumption than a static latch. On the other hand, a static latch is generally more stable than a dynamic latch. In short, both dynamic and static latches have favorable and unfavorable characteristics that need to be compromised in circuit design.

SUMMARY OF THE INVENTION

According to the invention, a bistable device has first and second complementary input terminals and first and second bistable states that are determined by the polarity of the signal applied to one of the input terminals. A source of an uninverted binary input signal, preferably an uninverted data stream, has a first value or a second value. A source of an inverted binary input signal, preferably an inverted data stream, has a first value or a second value in complementary relationship to the values of the uninverted input signal. A first source of a trigger signal has one polarity. A second source of a trigger signal has the other polarity. The trigger signals could be the bias potential supplies for the transistors of the bistable device. The first trigger signal is applied to the first input terminal and the second trigger signal is applied to the second input terminal to drive the bistable device into the first stable state when the input signal has the first value. The first trigger signal is applied to the second input terminal and the second trigger signal is applied to the first input terminal to drive the bistable device into the second stable state when the input signal has the second value. As a result, the bistable device is triggered in push-pull fashion responsive to the binary input signal.

A feature of the invention is a latch that can be converted between a dynamic mode and a static mode. Cross-coupled connections are formed between the output of a first bistable stage and the input of a second bistable stage and between the input of the second bistable stage and the output of the first bistable stage so that the first and second stages are alternately cut off or float. Preferably, cross-coupled connections are also formed between the output of a third bistable stage and the input of a fourth bistable stage and between the output of the fourth bistable stage and the input of the third bistable stage so that the third and fourth stages are alternately cut off or float. The first and second stages are conditionally connected in parallel and the second and fourth stages are conditionally connected in parallel to form a static latch when the connection is in place and a dynamic latch when the connection is not in place. By controlling the conditional connections, the latch can be converted between a static mode and a dynamic mode.

BRIEF DESCRIPTION OF THE DRAWINGS

The features of a specific embodiment of the best mode contemplated of carrying out the invention are illustrated in the drawings, in which.

DETAILED DESCRIPTION OF THE SPECIFIC EMBODIMENT

Figure 1:
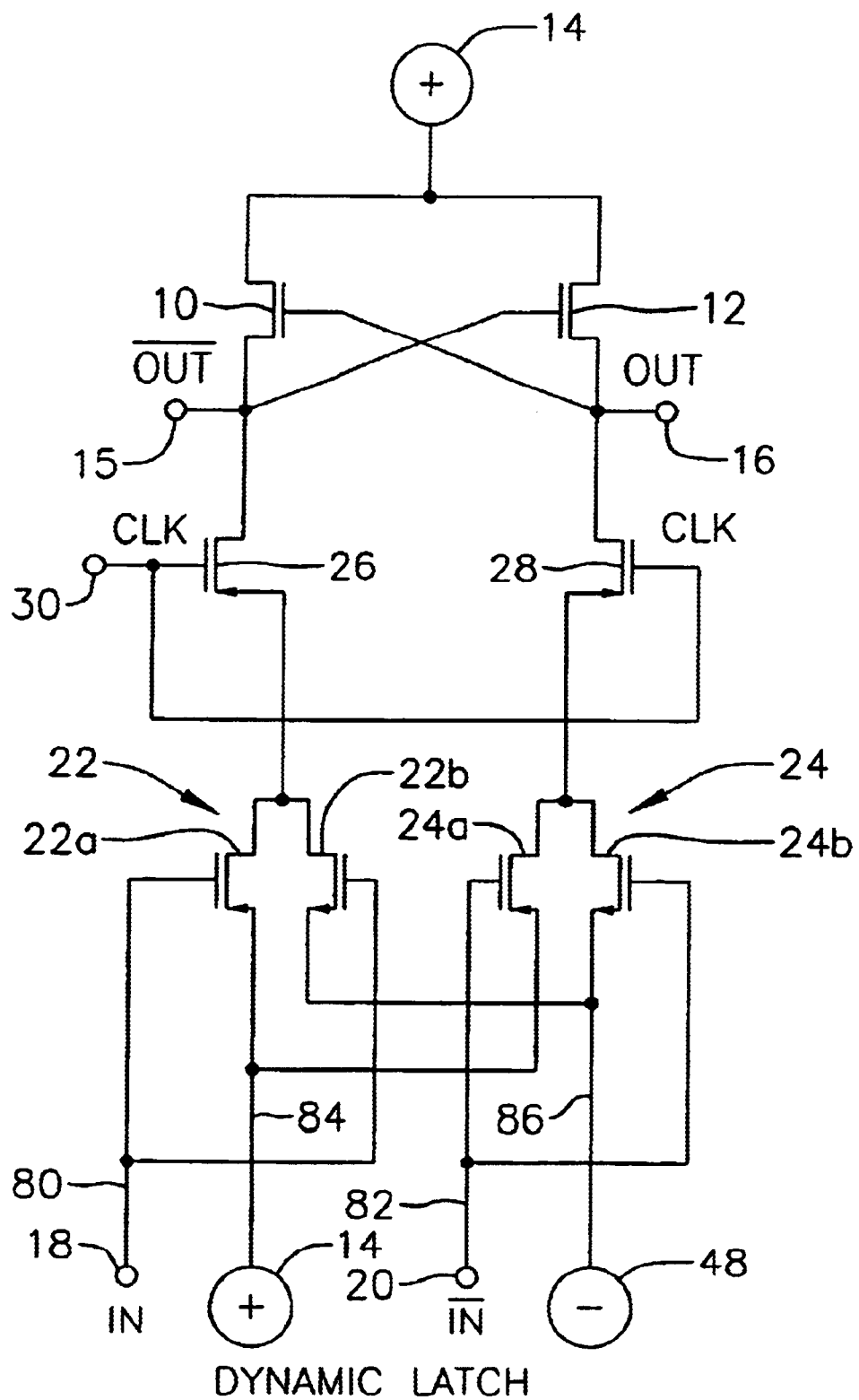
FIG. 1 is a circuit schematic diagram of a dynamic latch incorporating principles of the invention.

As illustrated in FIG. 1, a dynamic latch has P-type CMOS transistors 10 and 12 connected in a cross-coupled arrangement to form a bistable device. The sources of transistors 10 and 12 are each connected to a supply 14 of positive bias potential. The drains of transistors 10 and 12 are connected to complementary output terminals 15 and 16, respectively. In addition, the drain of transistor 10 is connected to the gate of transistor 12 and the drain of transistor 12 is connected to the gate of transistor 10. Complementary input terminals 18 and 20 are coupled by invertors 22 and 24, respectively, to the sources of P-type CMOS clocking transistors 26 and 28, respectively. Invertor 22 comprises a P-type CMOS transistor 22a and an N-type CMOS transistor 22b. Input terminal 18 is connected to the gates of transistors 22a and 22b. The drains of transistors 22a and 22b are connected to the source of transistor 26. The source of transistor 22a is connected to bias supply 14. The source of transistor 22b is connected to a supply of negative bias potential 48. Similarly, invertor 24 comprises a P-type CMOS transistor 24a and an N-type CMOS transistor 24b. Input terminal 20 is connected to the gates of transistors 24a and 24b. The drains of transistors 24a and 24b are connected to the source of transistor 28. The source of transistor 24a is connected to bias supply 14. The source of transistor 24b is connected bias supply 48. Complementary data streams could be fed to input terminals 18 and 20, respectively. A clock terminal 30 is connected to the gates of transistors 26 and 28. The drains of transistors 26 and 28 are connected to the drains of transistors 10 and 12, respectively.

Cross coupled transistors 10 and 12 form a bistable circuit that is triggered responsive to the complementary states of input terminals 18 and 20 upon application of each negative clock pulse to terminal 30. The state of the bistable circuit represents the value of the data at input terminals 18 and 20 when the negative clock pulses are applied thereto. When the negative clock pulse at clock terminal 30 ends, output terminals 15 and 16 retain the same state until the next negative clock pulse.

Specifically, when a negative clock pulse is applied to clock terminal 30 and the data at input terminal 18 is a low value, transistor 22a becomes conducting, transistor 22b becomes non-conducting, and the positive potential of bias supply 14 is applied to output terminal 15. Since the data at input terminal 20 at this time is a high value, transistor 24b becomes conducting, transistor 24a becomes non-conducting, and the negative potential of bias supply 48 is applied to output terminal 16.

When a negative clock pulse is applied to clock terminal 30 and the data at input terminal 18 is a high value, transistor 22b becomes conducting, transistor 22a becomes non-conducting, and the negative potential of bias supply 48 is applied to output terminal 15. Since the data at input terminal 20 at this time is a low value, transistor 24a becomes conducting, transistor 24b becomes non-conducting, and the positive potential of bias supply 14 is applied to output terminal 16.

In summary, the positive and negative potentials of supplies 14 and 48, respectively, which serve as trigger signals, are applied to output terminals 15 and 16 in push-pull fashion: a positive potential is applied to output terminal 15 as a trigger when a negative potential is applied to output terminal 16 as a trigger, and visa-versa. As a result of the push-pull action, the bistable circuit operates at high speed, i.e., it transitions rapidly from one state to the other, and does not consume much power.

Figure 2:
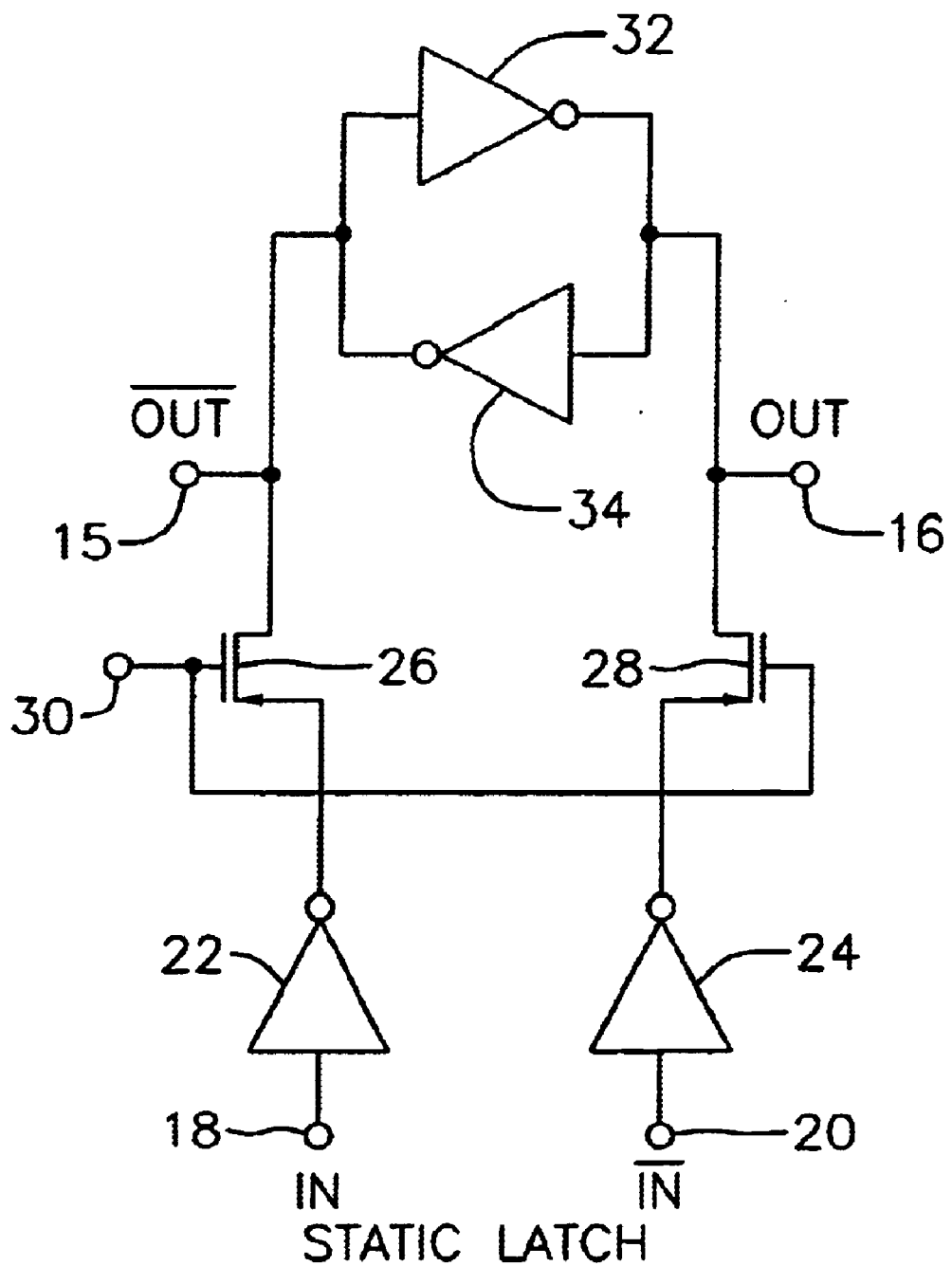
FIG. 2 is a circuit schematic diagram of a static latch incorporating principles of the invention.

In the static latch of FIG. 2, the same reference numerals are used to designate the components in common with the dynamic latch of FIG. 1. Back-to-back invertors 32 and 34 are connected between output terminals 15 and 16 to form a bistable circuit that is triggered by the states of input terminals 18 and 20 upon application of each negative clock pulse to terminal 30. Invertors 32 and 34 each comprise a pair of complementary CMOS transistors having their gates connected together, their drains connected together and their sources connected to a supply of bias potential. One of the complementary transistors is normally saturated, while the other complementary transistor is cut off. Switching is ordinarily slower than the dynamic latch because the conducting transistor is saturated.

Figure 3:
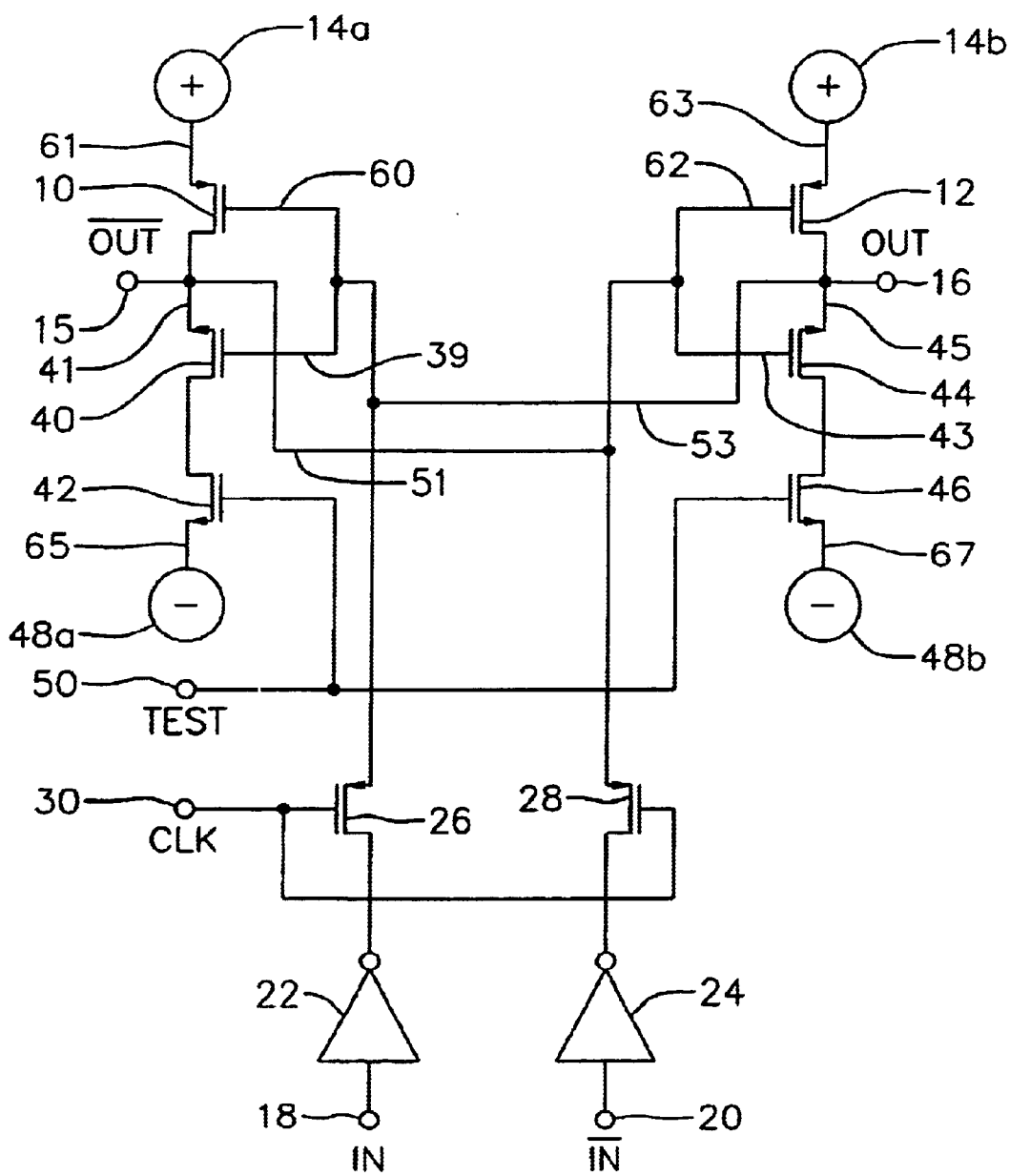
FIG. 3 is a circuit schematic diagram of a convertible latch incorporating principles of the invention.

In the convertible latch of FIG. 3, the same reference numerals are used to designate the components in common with the dynamic latch of FIG. 1. Bias supply 14 of FIG. 1 is shown as separate bias potential supplies 14a and 14b in FIG. 3. Transistor 10 serves as a first bistable stage having an input 60 and a permanent connection 61 from bias source 14a to energize transistor 10. Transistor 12 serves as a second bistable stage having an input 62 and a permanent connection 63 from bias source 14b to energize transistor 12. In addition to these common components, the convertible latch has N-type CMOS transistors 40, 42, 44 and 46. The drain of transistor 40 is connected to output terminal 15, the gate of transistor 40 is connected to the gate of transistor 10, and the source of transistor 40 is connected through transistor 42 to a supply 48a of negative bias potential. Specifically, the source of transistor 40 is connected to the drain of transistor 42 and the source of transistor 42 is connected to bias potential 48a. Similarly, the drain of transistor 44 is connected to output terminal 16, the gate of transistor 44 is connected to the gate of transistor 12, and the source of transistor 44 is connected through transistor 46 to a supply 48b of negative bias potential. Specifically, the source of transistor 44 is connected to the drain of transistor 46 and the source of transistor 46 is connected to bias supply 48b. Bias supplies 48a and 48b could, in reality, be the same bias supply. Transistor 40 serves as a third bistable stage having an input 39 and a permanent connection 41 to output terminal 15. Transistor 44 serves as a fourth bistable stage having an input 43 and a permanent connection 45 to output terminal 16. A cross coupling lead 51 connects the outputs of the first and third bistable stages to the inputs of the second and fourth bistable stages. A cross coupling lead 53 connects the outputs of the second and fourth bistable stages to the inputs of the first and third bistable stages.

Transistor 42 serves as a first switch having a connection 65 from bias source 48a to energize transistor 40 when the first switch is closed. Transistor 46 serves as a second switch having a connection 67 from bias source 48b to energize transistor 44 when the second switch is closed. The first and second switches operate together-both are open or closed at the same time. When the first and second switches are open, the latch operates in a dynamic mode and when the first and second switches are closed, the latch operates in a static mode. A test terminal 50 is connected to the gates of transistors 42 and 46.

When a positive pulse is applied to test terminal 50, i.e., a binary "1", transistors 42 and 46 conduct, i.e., they are turned on, by negative clock pulses applied to terminal 30. As a result, transistor 40 is connected to transistor 10 between bias supplies 14a and 48a to form an inverter, i.e, inverter 34 in FIG. 2, and transistor 44 is connected to transistor 12 between bias supplies 14b and 48b to form an inverter, i.e., inverter 32 in FIG. 2. These back-to-back inverters function as a static latch. In operation of the static latch, when a binary "1", i.e., a high voltage level appears at input terminal 18, a binary "0", i.e., a low voltage level appears at input terminal 20, and a low voltage level appears at clock terminal 30, transistors 10 and 44 are conducting, transistors 12 and 40 are non-conducting, a binary "1", i.e., a high voltage appears at output terminal 15, and a binary "0", i.e., a zero voltage appears at output terminal 16. When a binary "1", i.e., a high voltage level appears at input terminal 20, a binary "0", i.e., a low voltage level appears at input terminal 18, and a low voltage level appears at clock terminal 30, transistors 10 and 44 are conducting, transistors 12 and 40 are non-conducting, a binary "1", i.e., a high voltage appears at output terminal 16, and a binary "0", i.e., a low voltage appears at output terminal 15.

When the positive pulse at terminal 50 ends, i.e., a binary "0" appears at terminal 50, transistors 42 and 46 stop conducting, so transistors 40 and 44 are no longer connected to transistors 10 and 12, respectively, to form back-to-back inverters, i.e. inverters 32 and 34. This leaves only transistors 10 and 12 cross-coupled to each other to function as a dynamic latch, as shown in FIG. 1. In operation of the dynamic latch, when a binary "1", i.e., a high voltage level appears at input terminal 18, transistor 10 becomes conductive, transistor 12 becomes non-conductive, a binary "1" appears at output terminal 15, and a binary "0" appears at output terminal 16. When a binary "1", i.e., a high voltage level appears at input terminal 20, transistor 12 becomes conductive, transistor 10 becomes non-conductive, a binary "1" appears at output terminal 16, and a binary "0" appears at output terminal 15. This dynamic latch is capable of operating at high speed because the output terminal at which the binary "0" appears floats because the transistor connected to this output terminal is non-conducting, i.e. cut off.

In summary, the latch of FIG. 3 is convertible between a dynamic mode when a positive pulse is not present on terminal 50 and a static mode when a positive pulse is present on terminal 50.

To enhance the speed of operation of the static latch it is preferable to design the latch so the conductive transistors float, rather than saturate. This can be done by proper selection of the gain of the transistors. As a result, the transistors can switch faster from a conductive state to a non-conductive state in the same manner as a dynamic latch.

Figure 4:
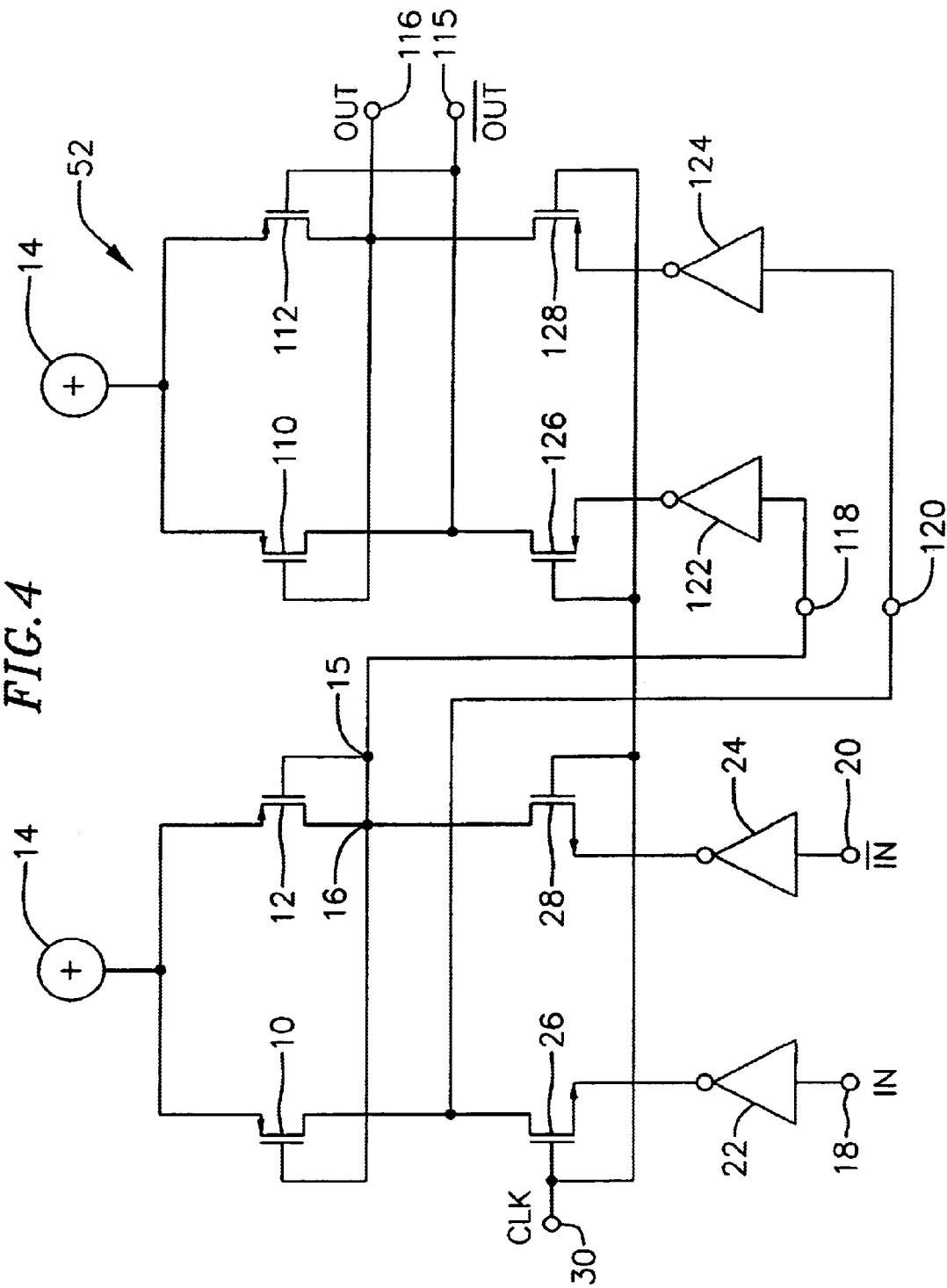
FIG. 4 is a circuit schematic diagram of a master-slave latch incorporating the principles of the invention.

In the master-slave latch of FIG. 4, the same reference numerals are used to designate the components of a master latch 50 in common with the dynamic latch of FIG. 1, except that clocking transistors 26 and 28 are N-type, instead of P-type and the clock pulses applied to terminal 30 are positive, instead of negative. The same reference numerals plus 100 are used to designate the components of a slave latch 52 in common with the dynamic latch of FIG. 1, i.e., transistor 110 is in common with transistor 10, etc. Output terminals 15 and 16 of master latch 50 are connected to input terminals 120 and 118, respectively of slave latch 52. Clock terminal 30 is connected to the gate of each of clocking transistors 26, 28, 126, and 128 without phase inversion. As a result, the state of data applied to input terminals 18 and 20 is stored in master latch 50 at the beginning of each clock cycle and is transferred to slave latch 52 at the middle of each clock cycle, so the state of output terminal 116 represents the value of the input data and the state of output terminal 115 represents the inverse of the state of the input data.

Figure 5:
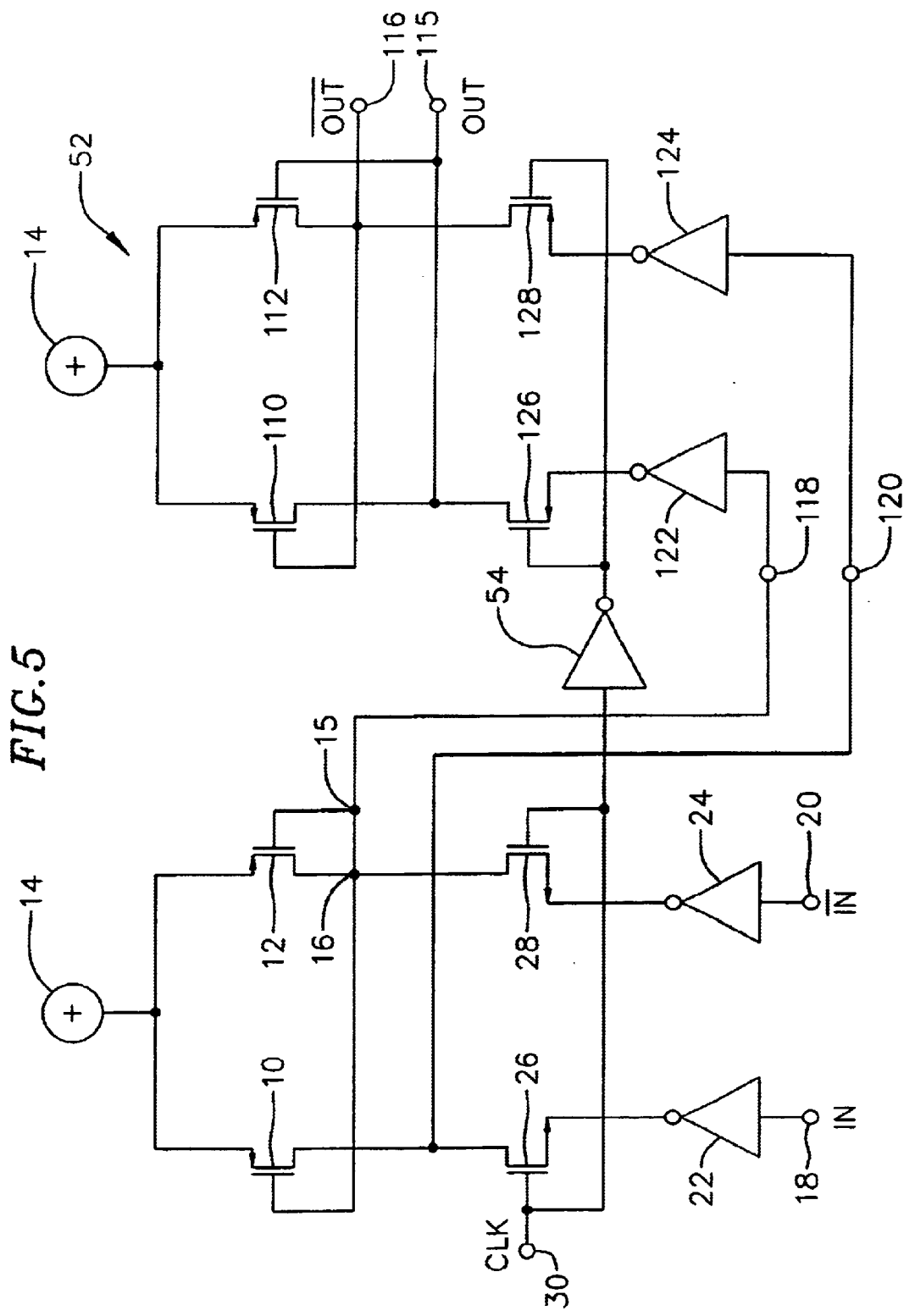
FIG. 5 is a circuit schematic diagram of another master-slave latch incorporating the principles of the invention.

In the master-slave latch of FIG. 5, the same reference numerals are used to designate the components in common with the master-slave latch of FIG. 4. In this embodiment, in contrast to FIG. 4, output terminals 15 and 16 of master latch 50 are connected to input terminals 118 and 120, respectively of slave latch 52, clock terminal 30 is connected to the gate of each of clocking transistors 126 and 128 with a phase inversion caused by an inverter 54, and the states of output terminals 115 and 116 are reversed, i.e., the state of output terminal 115 represents the value of the input data and the state of output terminal 116 represents the inverse of the state of the input data. As a result, the value of data applied to input terminals 18 and 20 is stored in master latch 50 at the beginning of each clock cycle and is transferred to slave latch 52 at the middle of each clock cycle.

In the embodiments of FIGS. 2, 3, 4, and 5, inverters 22, 24, 122, and 124 could be constructed as in FIG. 1, namely with complementary types of transistors 22a and 22b and 24a and 24b connected as shown in FIG. 1 to trigger the bistable devices in push-pull fashion.

The described embodiments of the invention are only considered to be preferred and illustrative of the inventive concept; the scope of the invention is not to be restricted to such embodiments. Various and numerous other arrangements may be devised by one skilled in the art without departing from the spirit and scope of this invention. For example, the convertible latch could be implemented in other types of transistor architectures.

What is claimed is:

1. A convertible latch comprising:
    a first bistable stage having an input and an output;
    a second bistable stage having an input and an output;
        cross coupled connections between the output of each of the first and second stages and the input of the other stage so the first and second stages are alternately cut off or float;
    a third bistable stage having an input and an output;
    a fourth bistable stage having an input and an output;
        cross coupled connections between the output of each of the third and fourth stages and the input of the other stage so the third and fourth stages are alternately cut off or saturated;
    means for conditionally connecting the first and third stages in parallel and connecting the second and fourth stages in parallel to form a static latch when the connection is in place and a dynamic latch when the connection is not in place.

2. A convertible latch capable of operating in a dynamic mode or a static mode, the latch comprising:
    a first bistable stage having an input and an output;
    a second bistable stage having an input and an output;
    a first bias source;
    means for permanently connecting the first bias source to the first and second stages to energize the first and second stages;
    cross coupled connections between the output of each of the first and second stages and the input of the other stage so the first and second stages alternately change state in a dynamic mode;
    a third bistable stage having an input and an output;
    a fourth bistable stage having an input and an output;
    a second bias source;
    means for conditionally connecting the second bias source to the third and fourth stages to energize the third and fourth stages when the conditional connection is in place;
    cross coupled connections between the output of each of the third and fourth stages and the input of the other stage so the third and fourth stages alternately change state with the second and first stages in a static mode when energized., the states of the first and fourth stages being the same and the states of the second and third stages being the same.

3. The convertible latch of claim 2, in which the first and third stages are transistors having opposite polarity.

4. The convertible latch of claim 3, in which the second and fourth stages are transistors having opposite polarity, the first and second stages are transistors having the same polarity, and the third and fourth stages are transistors having the same polarity.

5. The convertible latch of claim 4, in which the gains of the transistors of the first and second stages are selected so said transistors are alternately cut off or float in a dynamic latch mode.

6. The convertible latch of claim 5, in which the gains of the transistors of the third and fourth stages are selected so said transistors are alternately cut off or saturated in a dynamic latch mode.

7. The convertible latch of claim 6, in which the conditional connecting means comprises a first switch connecting the second bias source to the third stage and a second switch connecting the second bias source to the fourth stage.

8. The convertible latch of claim 7, in which the inputs of the transistors of the first and third stages are connected together and the inputs of the transistors of second and fourth stages are connected together.

9. The convertible latch of claim 8, in which the outputs of the transistors of the first and third stages are connected together and the outputs of the transistors of the second and fourth stages are connected together.

10. The convertible latch of claim 9, in which the transistors of the first and second stages each have a common terminal and the means for permanently connecting comprises a connection from the first bias source to the common terminals of the first and second stages.

11. The convertible latch of claim 10, in which the transistors of the third and fourth stages each have a common terminal and the means for conditional connecting comprises a connection from the second bias source to the common terminals of the third and fourth stages.

12. The convertible latch of claim 11, in which the first and second switches have a closed state when the conditional connection is in place to operate the latch in a static mode and an open state when the conditional connection is not in place to operate the latch in a dynamic mode.

13. The convertible latch of claim 2, in which the conditional connecting means comprises a first switch connecting the second bias source to the third stage and a second switch connecting the second bias source to the fourth stage.

14. The convertible latch of claim 4, in which the inputs of the transistors of the first and third stages are connected together and the inputs of the transistors of second and fourth stages are connected together.

15. The convertible latch of claim 14, in which the outputs of the transistors of the first and third stages are connected together and the outputs of the transistors of the second and fourth stages are connected together.

16. The convertible latch of claim 15, in which the gains of the transistors of the first and second stages are selected so said transistors are alternately cut off or float in a dynamic latch mode.

17. The convertible latch of claim 16, in which the gains of the transistors of the third and fourth stages are selected so said transistors are alternately cut off or saturated in a dynamic latch mode.

18. The convertible latch of claim 9, in which the transistors of the first and second stages each have a common terminal and the means for permanently connecting comprises a connection from the first bias source to the common terminals of the first and second stages.

19. The convertible latch of claim 4, in which the transistors of the third and fourth stages each have a common terminal and the means for conditionally connecting comprises a connection from the second bias source to the common terminals of the third and fourth stages.

20. The convertible latch of claim 13, in which the first and second switches have a closed state when the conditional connection is in place to operate the latch in a static mode and an open state when the conditional connection is not in place to operate the latch in a dynamic mode.

21. A convertible latch comprising:
   a bias supply having first and second terminals at different potentials;
   a first switch having a control terminal, an output terminal, and a common terminal connected to the first terminal of the bias supply to bias the first switch for bistable operation;
   a second switch having a control terminal connected to the control terminal of the first switch, an output terminal connected to the output terminal of the first switch, and a common terminal;
   a third switch having a control terminal, an output terminal, and a common terminal connected to the first terminal of the bias supply to bias the third switch for bistable operation;
   a fourth switch having a control terminal connected to the control terminal of the third switch, an output terminal connected to the output terminal of the third switch, and a common terminal connected to the second terminal of the bias supply to bias the fourth switch for bistable operation;
   a first cross connection from the output terminals of the first and second switches to the control terminals of the third and fourth switches;
   a second cross connection from the output terminals of the third and fourth switches to the control terminals of the first and second switches;
   a test terminal;
   a fifth switch having a control terminal connected to the test terminal, an output terminal connected to the common terminal of the second switch, and a common terminal connected to the second terminal of the bias supply to bias the second switch for bistable operation when the fifth switch is conductive and disable the second switch when the fifth switch is non-conductive; and
   a sixth switch having a control terminal connected to the test terminal, an output terminal connected to the common terminal of the fourth switch, and a common terminal connected to the second terminal of the bias supply to bias the fourth switch for bistable operation when the sixth switch is conductive and disable the fourth switch when the sixth switch is non-conductive.

22. The latch of claim 21, in which the first, and third switches are CMOS transistors of one type and the second, fourth, fifth, and sixth switches are CMOS transistors of a type complementary to the one type.

23. The latch of claim 22, in which the gains of the transistors are such that the first and third switches alternately float and cut-off when the second and fourth switches are non-conductive.

24. The latch of claim 22, in which the potentials of the bias supply are such that the first and third switches alternately saturate and cut-off when the second and fourth switches are non-conductive.

25. The latch of claim 21, additionally comprising complementary input terminals connected respectively to the control terminals of the first and second switches and the control terminals of the third and fourth switches.

26. The latch of claim 25 additionally comprising complementary output terminals connected respectively to the output terminals of the first and second switches and the output terminals of the third and fourth switches.

27. The latch of claim 26, additionally comprising a first clocking switch connected between one of the complementary input terminals and the control terminals of the first and second switches and a second clocking switch connected between the other of the complementary input terminals and the control terminals of the third and fourth switches.

\* \* \* \* \*